United States Patent
Kataoka et al.

(10) Patent No.: US 11,101,351 B2
(45) Date of Patent: Aug. 24, 2021

(54) GROUP III NITRIDE SEMICONDUCTOR DEVICE AND METHOD OF MANUFACTURING GROUP III NITRIDE SEMICONDUCTOR SUBSTRATE

(71) Applicant: KABUSHIKI KAISHA TOYOTA CHUO KENKYUSHO, Nagakute (JP)

(72) Inventors: Keita Kataoka, Nagakute (JP); Tetsuo Narita, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 101 days.

(21) Appl. No.: 16/245,003

(22) Filed: Jan. 10, 2019

(65) Prior Publication Data

US 2019/0245045 A1    Aug. 8, 2019

(30) Foreign Application Priority Data

Feb. 6, 2018  (JP) .............................. JP2018-019460

(51) Int. Cl.
| | |
|---|---|
| *H01L 29/20* | (2006.01) |
| *H01L 29/78* | (2006.01) |
| *H01L 29/423* | (2006.01) |
| *H01L 29/08* | (2006.01) |
| *H01L 29/10* | (2006.01) |
| *H01L 21/02* | (2006.01) |

(Continued)

(52) U.S. Cl.
CPC .... *H01L 29/2003* (2013.01); *H01L 21/02389* (2013.01); *H01L 21/266* (2013.01);
(Continued)

(58) Field of Classification Search
CPC ............. H01L 29/2003; H01L 29/7813; H01L 29/4236; H01L 29/0865; H01L 29/1095;
(Continued)

(56) References Cited

U.S. PATENT DOCUMENTS

| | | | | |
|---|---|---|---|---|
| 2007/0194309 A1* | 8/2007 | Yoon | ................... | H01L 21/0254 257/46 |
| 2009/0230513 A1* | 9/2009 | Yoo | ..................... | H01L 21/2654 257/609 |

(Continued)

FOREIGN PATENT DOCUMENTS

| | | |
|---|---|---|
| JP | H02-39436 A | 2/1990 |
| JP | 2002-176004 A | 6/2002 |

(Continued)

OTHER PUBLICATIONS

Kojima et al; "Nitrogen vacancies as a common element of the green luminescence and nonradiative recombination centers in Mg-implanted GaN layers formed on a GaN substrate"; Applied Physics Express 10; 2017; pp. 061002-1-061002-4.

(Continued)

*Primary Examiner* — Eugene Lee
(74) *Attorney, Agent, or Firm* — Oliff PLC

(57) ABSTRACT

A method of manufacturing a group III nitride semiconductor substrate may comprise introducing group III element vacancies to a first region of the group III nitride semiconductor substrate. The method may comprise introducing an acceptor element to a second region of the group III nitride semiconductor substrate. The second region may contact the first region at least in part. The method may comprise performing annealing to activate the acceptor element in the second region.

10 Claims, 10 Drawing Sheets

(51) Int. Cl.
*H01L 29/06* (2006.01)
*H01L 29/66* (2006.01)
*H01L 21/266* (2006.01)
*H01L 21/324* (2006.01)

(52) U.S. Cl.
CPC ........ *H01L 21/324* (2013.01); *H01L 29/0619* (2013.01); *H01L 29/0865* (2013.01); *H01L 29/1095* (2013.01); *H01L 29/4236* (2013.01); *H01L 29/66734* (2013.01); *H01L 29/7804* (2013.01); *H01L 29/7813* (2013.01)

(58) Field of Classification Search
CPC ........... H01L 21/02389; H01L 29/0619; H01L 29/66734; H01L 21/266; H01L 21/324; H01L 29/7804
See application file for complete search history.

(56) References Cited

U.S. PATENT DOCUMENTS

| | | | |
|---|---|---|---|
| 2010/0159625 A1* | 6/2010 | Lee | ........................ H01L 33/325 438/45 |
| 2016/0284563 A1 | 9/2016 | Niwa et al. | |
| 2017/0271148 A1 | 9/2017 | Takashima et al. | |
| 2017/0372905 A1* | 12/2017 | Takashima | ........ H01L 21/26546 |
| 2018/0005843 A1* | 1/2018 | Takashima | ........ H01L 29/66522 |
| 2018/0019322 A1* | 1/2018 | Takashima | ........ H01L 29/66666 |
| 2018/0097063 A1* | 4/2018 | Matsuyama | ...... H01L 21/02579 |
| 2019/0096991 A1* | 3/2019 | Niwa | .................... H01L 21/266 |

FOREIGN PATENT DOCUMENTS

| | | |
|---|---|---|
| JP | 2010-034397 A | 2/2010 |
| JP | 2016-181580 A | 10/2016 |
| JP | 2017-135174 A | 8/2017 |
| JP | 2017-168557 A | 9/2017 |

OTHER PUBLICATIONS

Jun. 9, 2020 Office Action issued in Japanese Patent Application No. 2018-019460.

* cited by examiner

GROUP III NITRIDE SEMICONDUCTOR DEVICE AND METHOD OF MANUFACTURING GROUP III NITRIDE SEMICONDUCTOR SUBSTRATE

CROSS-REFERENCE

This application claims priority to Japanese patent application No. 2018-019460, filed on Feb. 6, 2018, the entire contents of which are incorporated herein by reference.

TECHNICAL FIELD

The technique disclosed herein relates to a group III nitride semiconductor device and a method of manufacturing a group III nitride semiconductor substrate.

BACKGROUND

Japanese Patent Application Publication No. 1990-39436 describes forming a defect region in a part of a semiconductor substrate to configure this defect region as a gettering site of impurities and microcrystal defects.

SUMMARY

In a group III nitride semiconductor, nitrogen vacancies are generated upon introducing particles of an acceptor element. Here, GaN may be exemplified as the group III nitride semiconductor. Further, magnesium may be exemplified as the acceptor element. When a concentration of the nitrogen vacancies is high, acceptors are not activated, and thus there may be a case where a p-type region cannot be formed due to this. JP 1990-39436 A does not mention such a problem unique to a group III nitride semiconductor and does not provide any solution therefor. The description herein provides a technique that enables a high-quality p-type region to be formed in a group III nitride semiconductor.

One technique disclosed in the present application is a method of manufacturing a group III nitride semiconductor substrate. The method may comprise introducing group III element vacancies to a first region of the group III nitride semiconductor substrate. The method may comprise introducing an acceptor element to a second region of the group III nitride semiconductor substrate. The second region may contact the first region at least in part. The method may comprise performing annealing to activate the acceptor element in the second region.

DETAILED DESCRIPTION

Figure 1:
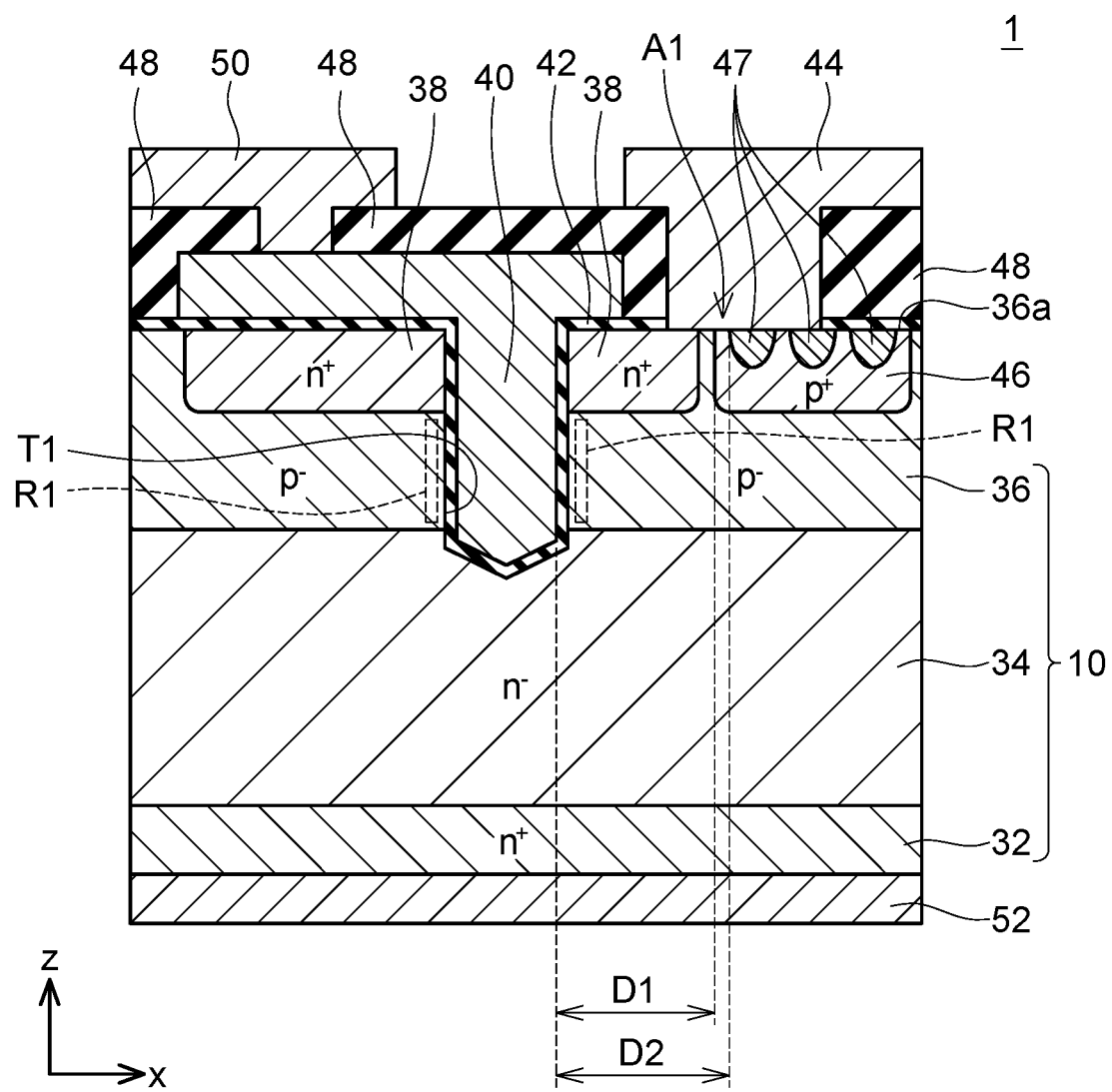
FIG. 1 is a schematic cross-sectional view of a semiconductor device 1 according to a first embodiment.
Figure 2:
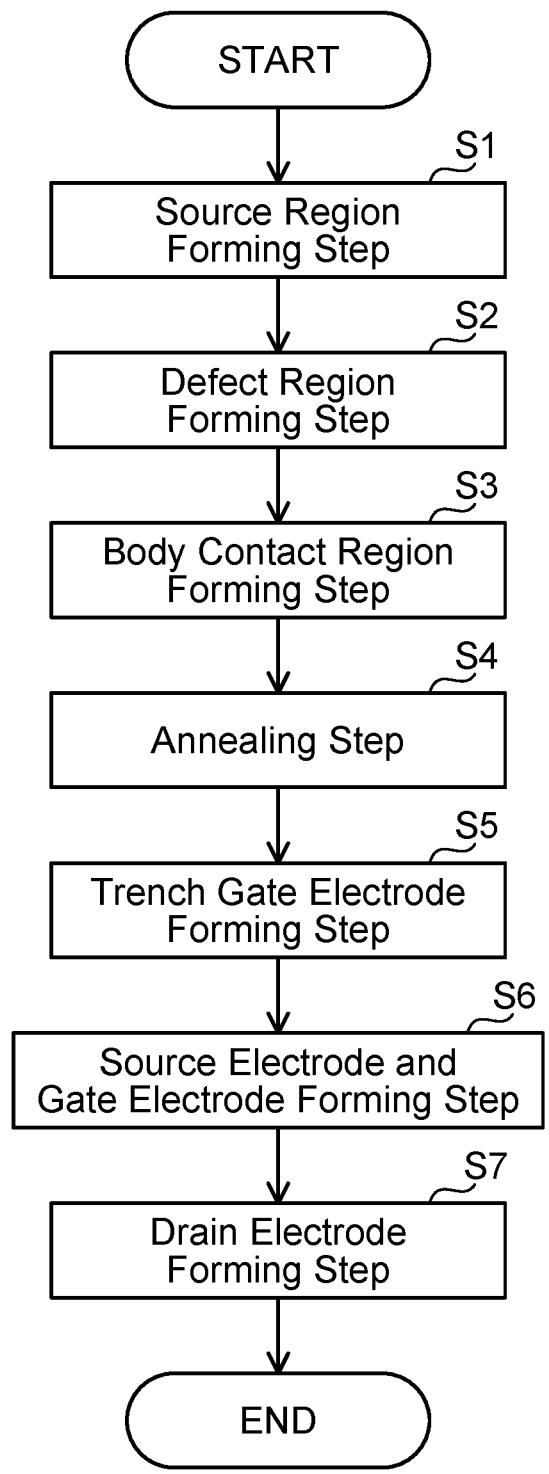
FIG. 2 is a flowchart showing a method of manufacturing the semiconductor device 1 according to the first embodiment.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved group III nitride semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure as well as for the purpose of restricting the claimed subject matter.

One technique disclosed in the present application is a method of manufacturing a group III nitride semiconductor substrate. The method may comprise introducing group III element vacancies to a first region of the group III nitride semiconductor substrate. The method may comprise introducing an acceptor element to a second region of the group III nitride semiconductor substrate. The second region may contact the first region at least in part. The method may comprise performing annealing to activate the acceptor element in the second region.

Nitrogen vacancies are formed upon when particles of the acceptor element are introduced to the second region. However, the nitrogen vacancies in the second region may be diffused to the first region through a contact interface between the first region and the second region upon annealing. Further, the nitrogen vacancies may be combined in group III element vacancies in the first region, by which a gettering effect is achieved. A nitrogen vacancy concentration in the second region can be reduced. As such, the second region may be fabricated as a p-type region.

the introducing of group III element vacancies may include ion-implanting group III element ions or inert gas ions.

One technique disclosed in the present application is a group III nitride semiconductor device. The device may comprise a first region and a second region. At least a part of the first region may contact the second region. The second region may include an acceptor element. A defect concentration in the first region may be higher than a defect concentration in the second region.

The defect concentration in the second region may be lower than an acceptor element concentration in the second region.

Particles of the acceptor element may be distributed in the second region according to an impurity distribution generated by ion implantation.

At least a part of the first region may include a group III element other than a group III element constituting the group III nitride semiconductor device, or an inert gas element.

The device may further comprise a group III nitride semiconductor substrate including a part of the first region and a part of the second region located on a surface of the group III nitride semiconductor substrate. The device may further comprise a first electrode contacting the part of the first region and the part of the second region that are located on the surface of the group III nitride semiconductor substrate.

The device may further comprise a group III nitride semiconductor substrate including a part of the second region located on a surface of the group III nitride semiconductor substrate and the first region located inside the group III nitride semiconductor substrate. The device may further comprise a first electrode contacting the part of the second region that is located on the surface of the group III nitride semiconductor substrate.

The device may further comprise an n-type drift layer. The device may further comprise a body layer disposed on an upper surface of the drift layer. The device may further comprise a trench gate extending from an upper surface of the body layer into the drift layer. The first region and the second region may be disposed inside the body layer. A distance between the second region and the trench gate may be smaller than a distance between the first region and the trench gate.

First Embodiment (Configuration of Semiconductor Device 1)

FIG. 1 shows a schematic cross-sectional view of a semiconductor device 1 according to the present embodiment. The semiconductor device 1 is a vertical MOSFET provided with a trench gate. The semiconductor device 1 is provided with a semiconductor substrate 10. The semiconductor substrate 10 has a structure in which a drain layer 32, a drift layer 34, and a body layer 36 are layered.

The drain layer 32 is an n$^+$-type GaN substrate. A drain electrode 52 is provided at a bottom surface of the drain layer 32. The drift layer 34 is disposed on an upper surface of the drain layer 32. The drift layer 34 is an n$^-$-type GaN layer epitaxially grown on the upper surface of the drain layer 32. A donor concentration thereof is set to 1E+16 cm$^{-3}$. The body layer 36 is a p-type GaN layer epitaxially grown on the drift layer 34. An acceptor concentration thereof is set to 1E+17 cm$^{-3}$. A source region 38 is an n$^+$-type GaN region provided at a position facing a part of an upper surface 36a of the body layer 36.

A body contact region 46 and defect regions 47 are disposed inside the body layer 36. The body contact region 46 is a p$^+$-type GaN region provided at a position facing a part of the upper surface 36a of the body layer 36. The body contact region 46 has particles of an acceptor element distributed according to an impurity distribution generated by ion implantation. A Gauss distribution may be exemplified as the impurity distribution generated by ion implantation. In this embodiment, magnesium is implanted as the acceptor element. Specifically, the body contact region 46 is formed by implanting particles of magnesium from the upper surface 36a of the body layer 36 in a depth direction (−z direction) thereof. In the body contact region 46, a defect concentration (that is, a nitrogen vacancy concentration) is lower than an acceptor element concentration (that is, a magnesium concentration). The magnesium concentration in the body contact region 46 may for example be 1E+19 cm$^{-3}$. Further, the nitrogen vacancy concentration may for example be 1E+18 cm$^{-3}$.

The defect regions 47 are disposed within the body contact region 46. That is, at least a part of each defect region 47 contacts the body contact region 46. The defect regions 47 are regions where crystal defects and vacancies generated by gallium, which is a group III element, are formed. Nitrogen is present in the defect regions 47. Nitrogen is an example of an inert gas element. A defect concentration (that is, a nitrogen vacancy concentration) in the defect regions 47 is higher than a defect concentration (that is, a nitrogen vacancy concentration) in the body contact region 46.

A trench gate electrode 40 extends from the upper surface 36a of the body layer 36 into the drift layer 34 by penetrating through the source region 38 and the body layer 36. The trench gate electrode 40 is an electrode provided within a trench T1 having its side and bottom surfaces covered by a gate insulating film 42. The trench gate electrode 40 extends to outside the trench T1 and contacts a gate electrode 50. The trench gate electrode 40 is constituted for example of polycrystalline silicon.

An interlayer insulating film 48 is a layer for ensuring insulation between the gate electrode 50 and a source electrode 44. Some parts of upper surfaces of the defect regions 47, a part of an upper surface of the body contact region 46, and a part of an upper surface of the source region 38 are located at an upper surface of the semiconductor substrate 10 in an opening A1 of the interlayer insulating film 48. The source electrode 44 contacts the aforementioned parts of the upper surfaces of the defect regions 47, the body contact region 46, and the source region 38.

(Method of Manufacturing Semiconductor Device 1)

A method of manufacturing the semiconductor device 1 will be described with reference to FIGS. 2 to 5. In a source region forming step is performed in step S1 of a flowchart of FIG. 2. Specifically, the semiconductor substrate 10 in which the drain layer 32, the drift layer 34, and the body layer 36 are layered is prepared. The semiconductor substrate 10 may be formed by growing the drift layer 34 and the body layer 36 on the drain layer 32 by a MOVPE method. A mask provided with an opening corresponding to the source region 38 is formed by using known photolithography technique and dry-etching processing. Silicon or germanium is ion-implanted to the body layer 36 via the mask. Due to this, the n$^+$-type source region 38 is formed.

Figure 3:
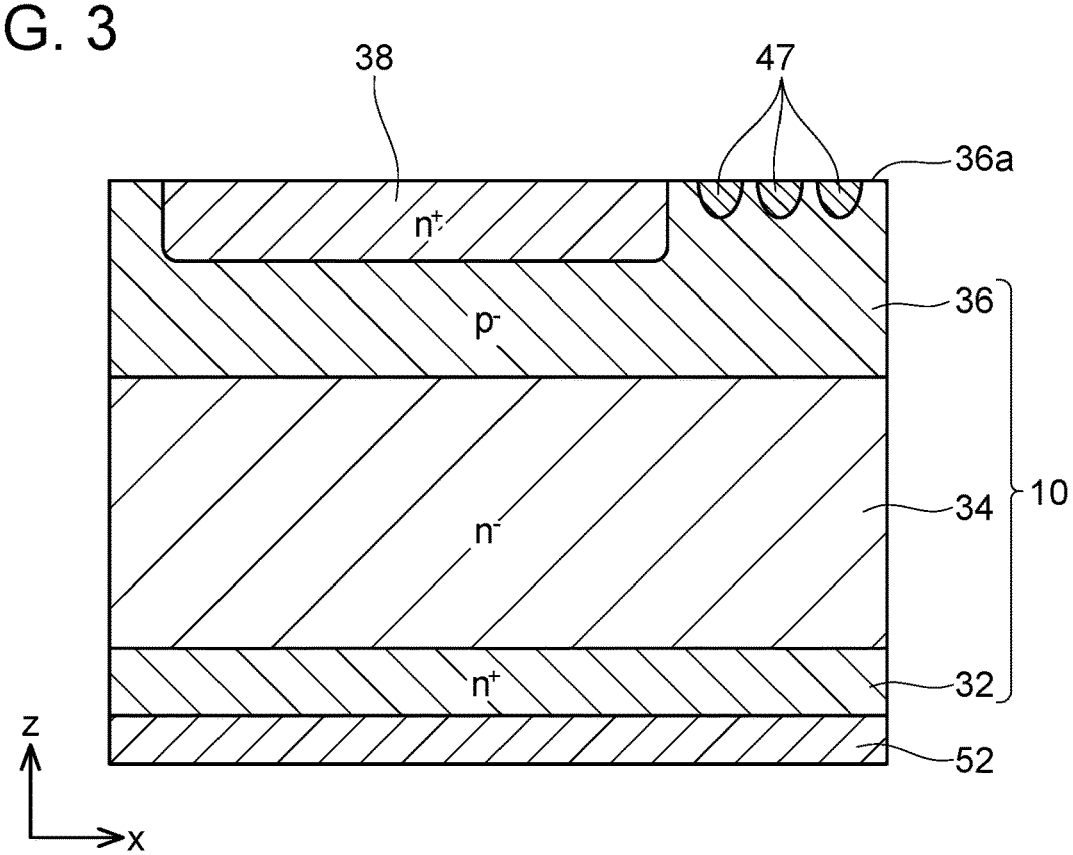
FIG. 3 shows a manufacturing step of the semiconductor device 1 according to the first embodiment.

In step S2, a defect region forming step is performed. Specifically, nitrogen is ion-implanted to the body layer 36 via a mask provided with openings corresponding to the defect regions 47. Due to this, the defect regions 47 are formed, and a structure shown in FIG. 3 is completed. The defect regions 47 are regions where gallium vacancies are formed. An in-plane shape of the defect regions 47 may be controlled by the shape of the openings of the mask. Further, a depth profile of the defect regions 47 from the upper surface 36a of the body layer 36 may be adjusted by adjusting energy of the nitrogen implantation. Further, a presence concentration of the gallium vacancies in the defect regions 47 may be adjusted by adjusting a nitrogen dosage.

Figure 4:
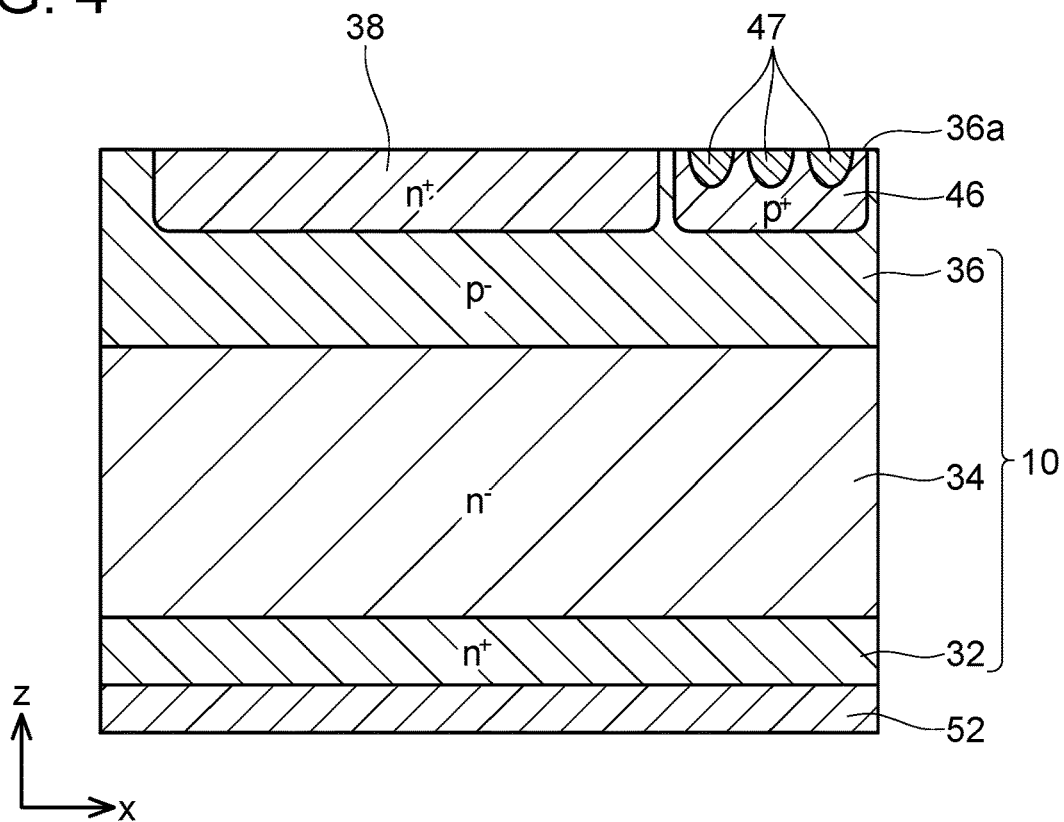
FIG. 4 shows a manufacturing step of the semiconductor device 1 according to the first embodiment.

In step S3, a body contact region forming step is performed. Specifically, magnesium is ion-implanted to the body layer 36 via a mask having an opening corresponding to the body contact region 46. Due to this, the body contact region 46 is formed, and a structure shown in FIG. 4 is completed. A depth of the body contact region 46 may be adjusted by adjusting energy of the magnesium implantation. Further, a magnesium concentration in the body contact region 46 may be adjusted by adjusting a magnesium dosage.

In step S4, an annealing step is performed. Specifically, the semiconductor substrate 10 is heated to 1200° C. or higher. As a first effect thereof, the nitrogen vacancies in the body contact region 46 can be diffused to the defect regions 47 through contact interfaces between the defect regions 47 and the body contact region 46. As a result, gallium vacancy/nitrogen vacancy composite defects are formed in the defect regions 47. Since these composite defects are thermally stable, the nitrogen vacancies are fixed in the defect regions 47. That is, the nitrogen vacancies can be combined in the gallium vacancies in the defect regions 47 by which a gettering effect is achieved. As a second effect, silicon or germanium in the source region 38 can be activated. Further, magnesium being the acceptor element in the body contact region 46 can be activated.

Figure 5:
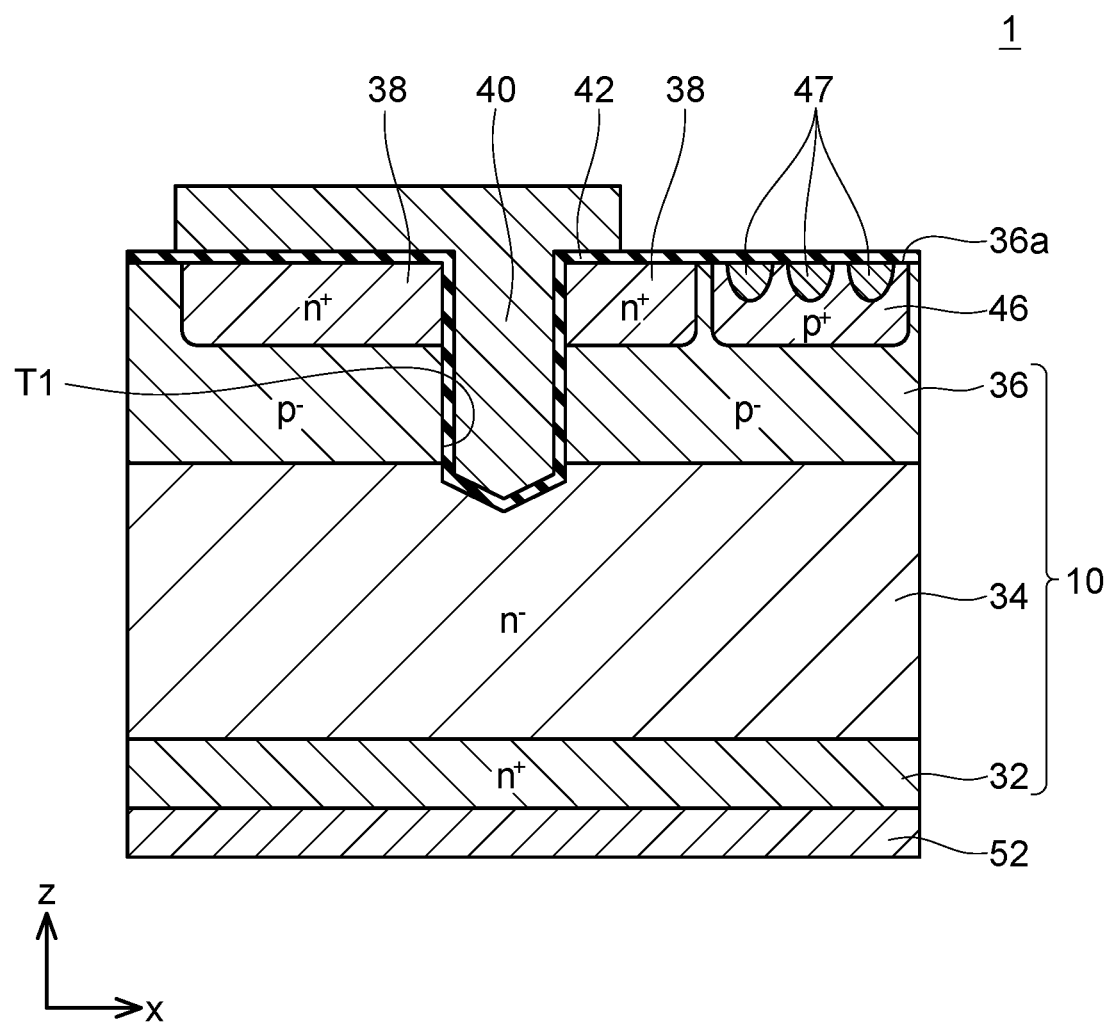
FIG. 5 shows a manufacturing step of the semiconductor device 1 according to the first embodiment.

In step S5, a trench gate electrode forming step is performed. Specifically, the trench T1 extending into the drift layer 34 by penetrating through the source region 38 and the body layer 36 is formed by using known photolithography technique and dry-etching processing. The gate insulating film 42 is formed within the trench T1 and on the upper surface of the semiconductor substrate 10. The gate insulating film 42 is an insulating film formed by depositing $SiO_2$ or $Al_2O_3$ by an atomic deposition method. Polysilicon doped with impurities such as boron is deposited by a LP-CVD method. The polysilicon around the trench T1 is removed by using known photolithography technique and dry-etching processing. Due to this, a structure shown in FIG. 5 is completed. Next, the structure shown in FIG. 5 is thermally treated. Resistance of the polysilicon can be reduced by performing the thermal treatment.

In step S6, a source electrode and gate electrode forming step is performed. Specifically, the interlayer insulating film 48 is deposited on an upper surface of the trench gate electrode 40. Then, the interlayer insulating film 48 and the gate insulating film 42 in ranges where the source electrode 44 and the gate electrode 50 are to be formed are removed by using known photolithography technique and dry-etching processing. A metal layer is deposited. This metal layer is then processed into the source electrode 44 and the gate electrode 50 by using known photolithography technique and dry-etching processing.

In step S7, a drain electrode forming step is performed. Specifically, a metal layer is deposited on the bottom surface of the drain layer 32. An electrode thereby formed is thermally treated. By performing the thermal treatment, contact resistance of the source electrode and the drain electrode can be reduced. According to the above, the semiconductor device 1 shown in FIG. 1 is completed.

(Operation of Semiconductor Device 1)

The semiconductor device 1 shown in FIG. 1 connects the drain electrode 52 to a high potential, grounds the source electrode 44, and changes a potential to be applied to the gate electrode 50. The $p^-$-type body layer 36 in a region R1 facing the trench gate electrode 40 via the gate insulating film 42 inverts to an n-type when a positive potential is applied to the gate electrode 50, the $n^+$-type source region 38 and the $n^-$-type drift layer 34 are thereby electrically connected by this inverted layer, and current flows between the source electrode 44 and the drain electrode 52. When the application of the positive potential to the gate electrode 50 is stopped, the inverted layer in the region R1 disappears, a depletion layer spreads in the drift layer 34, and the source electrode 44 and the drain electrode 52 become disconnected with a high-resistance state appearing therebetween.

Advantageous Effects

Primary defects introduced by the ion implantation are donor nitrogen vacancies. N-type regions such as the source region 38 will not become inactive even with presences of nitrogen vacancies therein. However, p-type regions such as the body contact region 46 are prone to become inactive due to presences of nitrogen vacancies, and they exhibit n-type characteristics due to this. Thus, in the technique described in this embodiment, the nitrogen vacancies in the body contact region 46 can be diffused by the annealing step of step S4 to the defect regions 47 through the contact interfaces between the defect regions 47 and the body contact region 46. Further, nitrogen vacancies can be combined in the gallium vacancies in the defect regions 47 and thus the gettering effect can be achieved. Due to this, the nitrogen vacancy concentration in the body contact region 46 can be reduced, and the body contact region 46 can be fabricated as high-quality p-type GaN. Further, due to this, the defect concentration (that is, the nitrogen vacancy concentration) in the body contact region 46 can be made lower than the magnesium concentration, which is the acceptor element. Due to this, the body contact region 46 can be prevented from being inactivated due to the nitrogen vacancies. The body contact region 46 does not exhibit n-type characteristics.

The source electrode 44 does not make ohmic contact with low-concentration p-type GaN but makes ohmic contact with high-concentration p-type GaN. In the semiconductor device 1 of the present embodiment, a part of the upper surface of the body contact region 46 contacts the source electrode 44 in the opening A1 of FIG. 1. Further, the body contact region 46 is fabricated as high-concentration p-type GaN by a gettering effect achieved by the defect regions 47. Thus, an ohmic contact can be achieved between the source electrode 44 and the body contact region 46.

The inverted layer is generated in the region R1 facing the trench gate electrode 40 via the gate insulating film 42 (see FIG. 1). That is, the region R1 is a region that determines a threshold voltage of the semiconductor device 1. As such, the threshold voltage might vary due to presence of defects near the region R1. In the semiconductor device 1 of the present embodiment, a distance D1 between the body contact region 46 and the trench gate electrode 40 (see FIG. 1) is smaller than a distance D2 between the defect regions 47 and the trench gate electrode 40. That is, the defect regions 47 are provided in a region farther away from the region R1. Due to this, the defects combined in the defect regions 47 as a result of the gettering does not affect the threshold voltage. Variation in the threshold voltage can be suppressed.

(Measurement Results of Defect Concentration)

Figure 6:
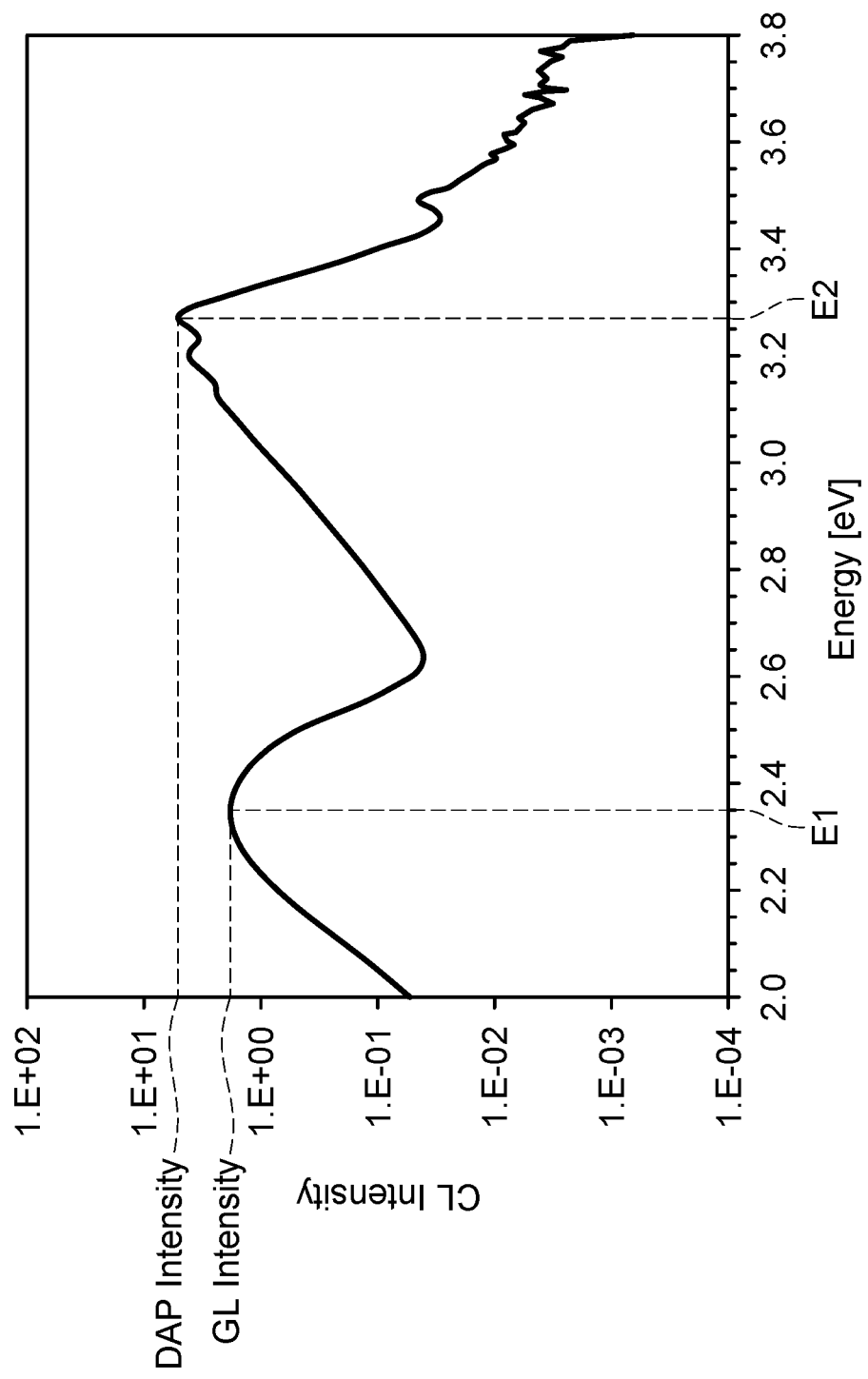
FIG. 6 is a graph of measurement results of a defect concentration and a magnesium acceptor concentration.
Figure 7:
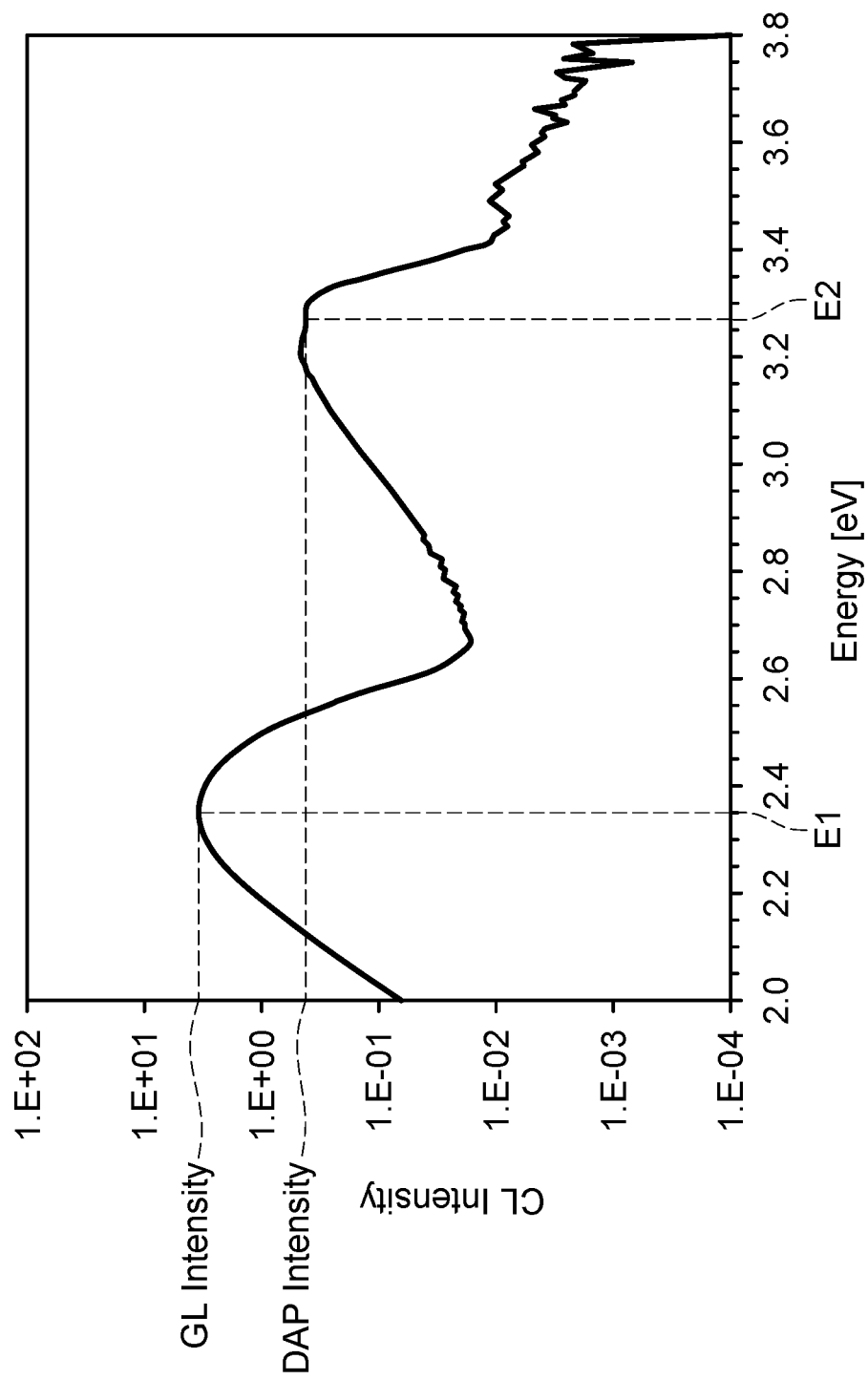
FIG. 7 is a graph of measurement results of the defect concentration and the magnesium acceptor concentration.

FIGS. 6 and 7 show graphs of measurement results of the defect concentration and the magnesium acceptor concentration. FIGS. 6 and 7 are the measurement results achieved by using a cathode luminescence (CL) method. A vertical axis indicates a cathode luminescence intensity. A horizontal axis indicates energy of light. Typical measurement conditions are described below. An electron beam acceleration voltage: 3 kV, an electron beam irradiation current: 1 nA, an electron beam probe diameter: a few nm, a spectrometer: a diffraction grating-type spectrometer (300 nm), a diffraction grating: 600 g/mm, a slit width: 10 micrometer, and a sample temperature: 10K.

The cathode luminescence intensity at energy E1 (2.35 eV) is a GL intensity. The GL intensity corresponds to the nitrogen vacancy concentration. The cathode luminescence intensity at energy E2 (3.27 eV) is a DAP intensity. The DAP intensity corresponds to the magnesium acceptor concentration. That is, the GL intensity and the DAP intensity can be compared to measure which one of the nitrogen vacancy concentration and the magnesium acceptor concentration is higher. In an example of FIG. 6, the DAP intensity is higher than the GL intensity. As such, it can be understood that the magnesium acceptor concentration is higher than the nitrogen vacancy concentration in a measured region of FIG. 6. On the other hand, the GL intensity is higher than the DAP intensity in an example of FIG. 7. As such, it can be understood that the magnesium acceptor concentration is lower than the nitrogen vacancy concentration in a measured region of FIG. 7.

In the cathode luminescence, a state analysis of an arbitrary location can be performed while confirming positions in a SEM image. That is, a local analysis can be performed. Thus, by measuring a cross section of a semiconductor device in detail using the cathode luminescence, this semiconductor device can be determined whether it is provided with the structure of the body contact region 46 and the defect regions 47 of FIG. 1.

Second Embodiment (Configuration of Semiconductor Device 1A)

Figure 8:
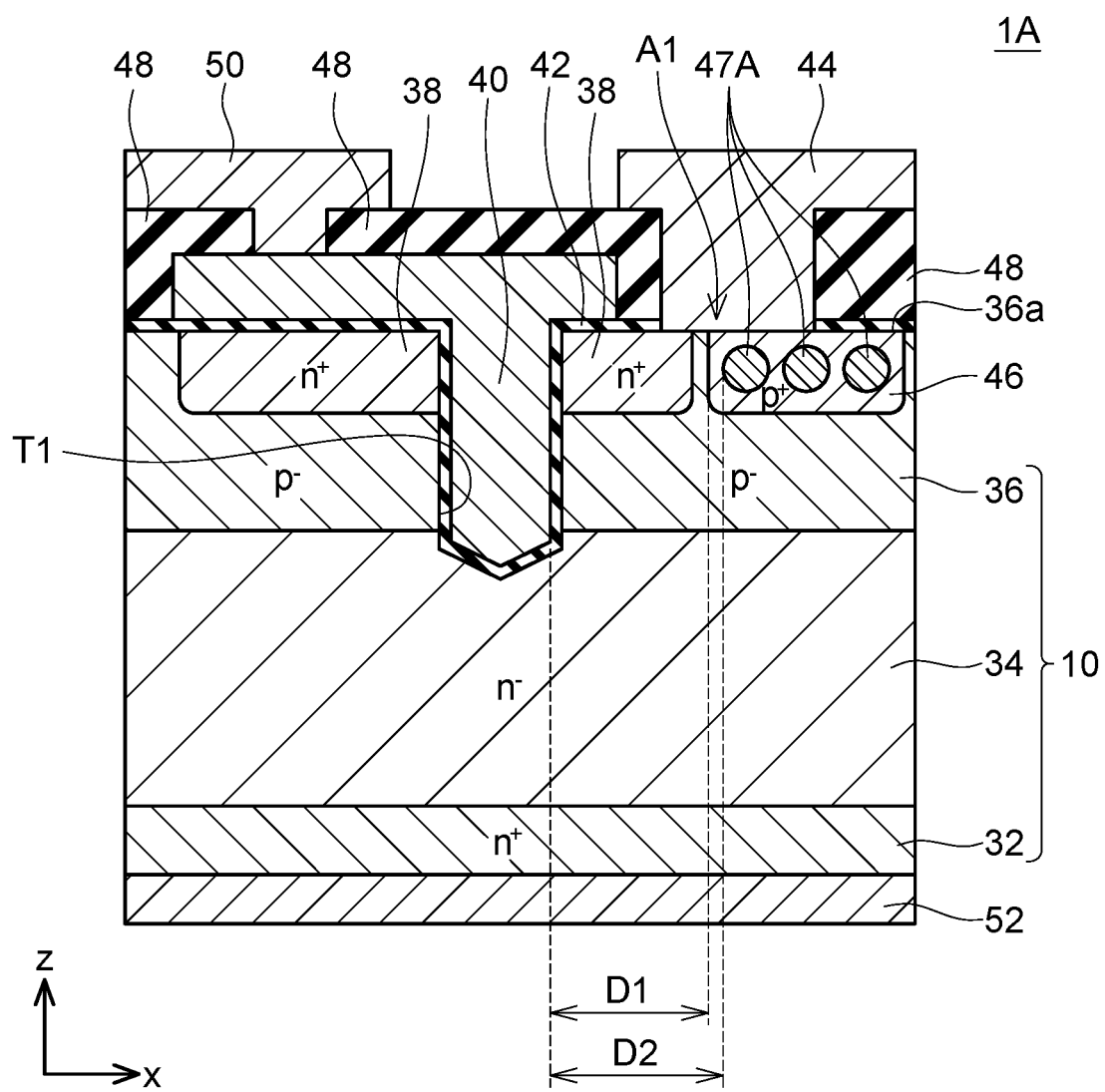
FIG. 8 is a schematic cross-sectional view of a semiconductor device 1A according to a second embodiment.

FIG. 8 shows a schematic cross-sectional view of a semiconductor device 1A according to the second embodiment. The semiconductor device 1A according to the second embodiment differs in a shape of defect regions 47A from the semiconductor device 1 according to the first embodiment. In the description below, configurations that are same between the semiconductor device 1A according to the second embodiment and the semiconductor device 1 according to the first embodiment are given same reference signs, and descriptions thereof will be omitted.

The defect regions 47A are disposed within the body contact region 46. That is, at least a part of each defect region 47A contacts the body contact region 46. A part of the upper surface of the body contact region 46 and a part of the upper surface of the source region 38 are located at the upper surface of the semiconductor substrate 10 in the opening A1 of the interlayer insulating film 48. The source electrode 44 contacts the aforementioned parts of the upper surfaces of the body contact region 46 and the source region 38.

The defect regions 47A are not located at the upper surface of the semiconductor substrate 10. Such defect regions 47A can be fabricated by adjusting the energy upon implanting nitrogen in the aforementioned defect region forming step of step S2. In the semiconductor device 1A with such defect regions 47A, same effects as those of the semiconductor device 1 according to the first embodiment can be achieved.

Third Embodiment (Configuration of Semiconductor Device 100)

Figure 9:
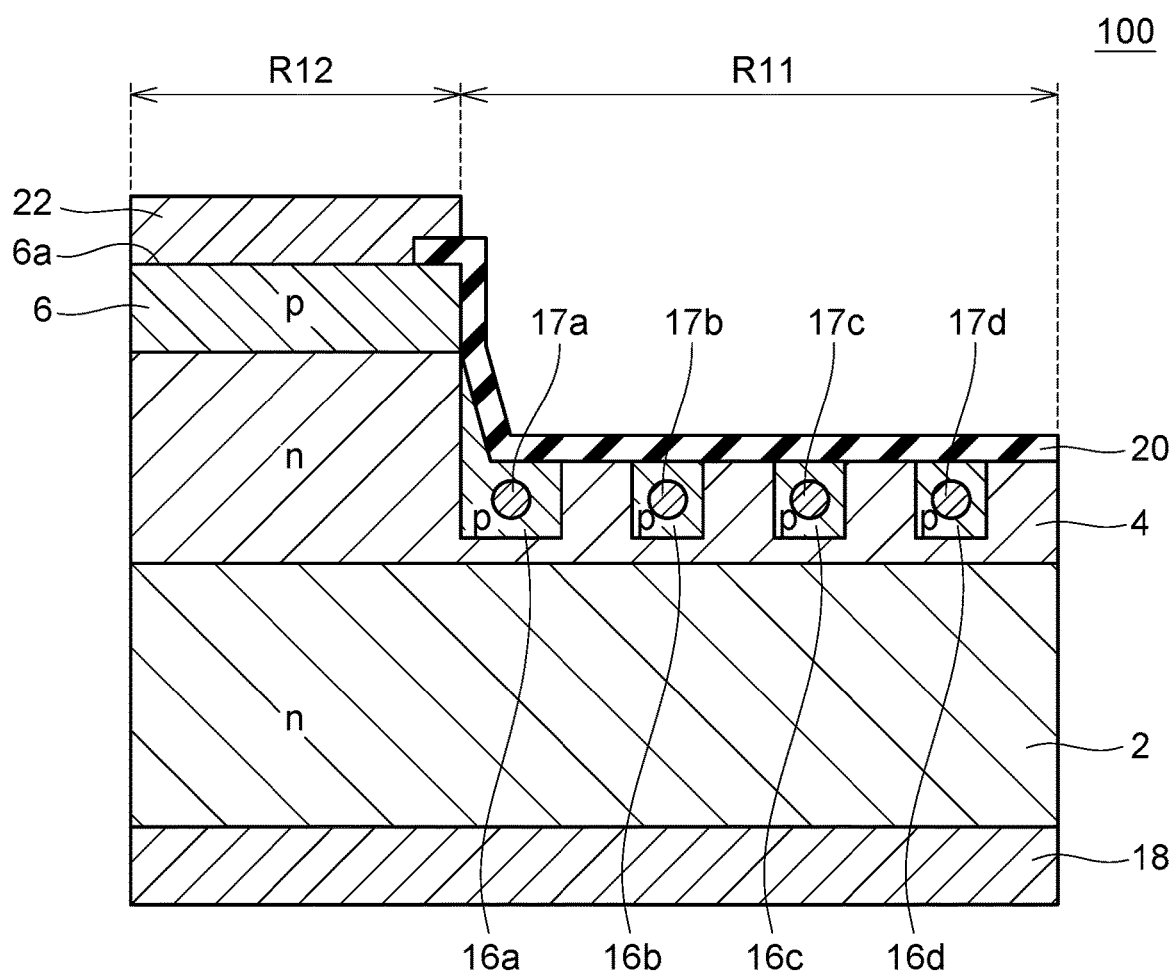
FIG. 9 is a schematic cross-sectional view of a semiconductor device 100 according to a third embodiment.

FIG. 9 shows a schematic cross-sectional view of a semiconductor device 100 according to the third embodiment. As shown in FIG. 9, the semiconductor device 100 according to the third embodiment is an example in which the technique taught herein is adapted to a peripheral region R11 of a semiconductor element. Specifically, it is an example in which p-type guard rings 16a, 16b, 16c, 16d are provided at parts of an n-type GaN layer 4. In the semiconductor device 100, a diode is provided in a center region R12 of a semiconductor chip. An element to be provided in the center region R12 is not limited to a diode, and various element(s) may be provided.

A bottom surface electrode 18 is provided on a bottom surface of an n-type GaN substrate 2. The n-type GaN layer 4 is provided on an upper surface of the GaN substrate 2. A p-type GaN layer 6 is provided on an upper surface of the GaN layer 4. The p-type GaN layer 6 and the n-type GaN layer 4 configures a vertical diode structure. In the peripheral region R11, the GaN layer 4 has the p-type guard rings 16a to 16d provided therein. The guard rings 16a to 16d can be formed by ion-implanting magnesium in the GaN layer 4 via a mask provided with openings corresponding to the guard rings 16a to 16d.

Defect regions 17a to 17d are provided inside the guard rings 16a to 16d. That is, at least a part of each of the defect regions 17a to 17d contacts its corresponding one of the guard rings 16a to 16d. Contents of the defect regions 17a to 17d are same as those of the aforementioned defect regions 47. In the peripheral region R11, an insulating film 20 is provided on upper surfaces of the GaN layer 4 and the guard rings 16a to 16d. An upper surface electrode 22 is provided on an upper surface 6a of the GaN layer 6.

Advantageous Effects

Nitrogen vacancies in the guard rings 16a to 16d can be combined in gallium vacancies in the defect regions 17a to 17d, by which the gettering effect can be achieved. Due to this, a nitrogen vacancy concentration in each of the guard rings 16a to 16d can be reduced, by which the guard rings 16a to 16d can be fabricated as high-quality p-type GaN. An electric field alleviating function of the guard rings 16a to 16d can be increased.

Electric fields concentrate at pn junctions between the p-type guard rings 16a to 16d and the n-type GaN layer 4. When there are defects present in a vicinity of such an electric field concentrated portion, a voltage resistance might be deteriorated. In the semiconductor device 100 of the present embodiment, the defect regions 17a to 17d are disposed within the respective guard rings 16a to 16d. That is, each of the defect regions 17a to 17d is disposed in a region that is separated farther from the pn junctions. Due to this, the defects trapped in the defect regions 17a to 17d by the gettering effect do not adversely affect the voltage resistance.

Fourth Embodiment (Configuration of Semiconductor Device 200)

Figure 10:
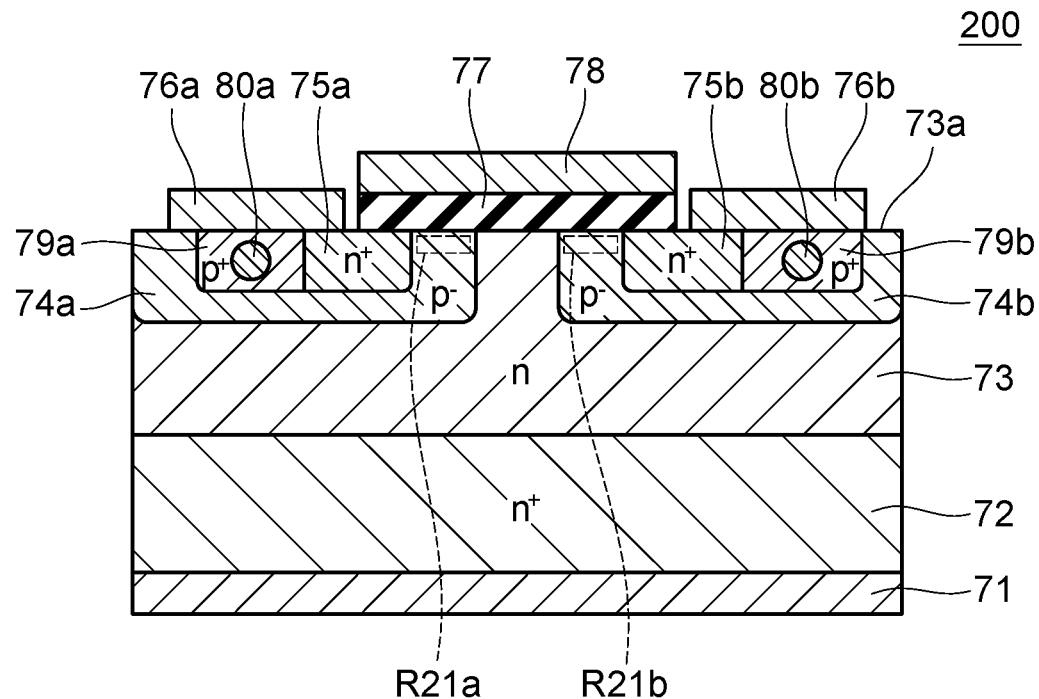
FIG. 10 is a schematic cross-sectional view of a semiconductor device 200 according to a fourth embodiment.

FIG. 10 shows a schematic cross-sectional view of a semiconductor device 200 according to the fourth embodiment. The semiconductor device 200 is a vertical MOSFET provided with a planar gate. In the semiconductor device 200 of FIG. 10, a drain layer 72 is an $n^+$-type GaN substrate. A drain electrode 71 is provided on a bottom surface of the drain layer 72. A drift layer 73 being an n-type GaN layer is provided on an upper surface of the drain layer 72. Body regions 74a and 74b are $p^-$-type conductive regions obtained by ion-implanting magnesium from an upper surface 73a of the drift layer 73 and thermally treating the same. Source regions 75a and 75b are $n^+$-type conductive regions obtained by implanting silicon from the upper surface 73a and thermally treating the same.

The drift layer 73 is provided with body contact regions 79a and 79b therein. The body contact regions 79a and 79b are $p^+$-type conductive regions obtained by ion-implanting magnesium from the upper surface 73a of the drift layer 73 and thermally treating the same. Defect regions 80a and 80b are disposed within the body contact regions 79a and 79b. That is, at least a part of each of the defect regions 80a and 80b contacts its corresponding one of the body contact regions 79a and 79b. Upper surfaces of the body contact regions 79a and 79b and upper surfaces of the source regions 75a and 75b are located at the front surface 73a. Source electrodes 76a, 76b contact the corresponding upper surfaces of the body contact regions 79a, 79b and the source regions 75a, 75b. A gate electrode 78 is provided on the upper surfaces of the source regions 75a and 75b, the body regions 74a and 74b, and the drift layer 73 via a gate insulating film 77.

Advantageous Effects

In addition to nitrogen vacancies in the body contact regions 79a and 79b, nitrogen vacancies in the in the body regions 74a and 74b can also be combined in gallium vacancies in the defect regions 80a and 80b, by which the gettering effect can be achieved. Due to this, nitrogen vacancy concentrations in the body contact regions 79a and 79b and in the body regions 74a and 74b can be reduced, by which these regions can be fabricated as high-quality p-type GaN.

Inverted layers are generated in regions R21a and R21b facing the gate electrode 78 via the gate insulating film 77. That is, the regions R21a and R21b are regions that determine a threshold voltage of the semiconductor device 200. In the semiconductor device 200 of the present embodiment, the defect regions 80a and 80b are disposed within the body contact regions 79a, 79b. That is, the defect regions 80a and 80b are disposed in regions separated farther from the regions R21a and R21b. Due to this, the defects trapped in the defect region 80a and 80b by the gettering effect do not adversely affect the threshold voltage.

Electric fields concentrate at pn junctions between the p-type body regions 74a and 74b and the n-type drift layer 73. When there are defects present in the vicinity of such an electric field concentrated portion, the voltage resistance might be deteriorated. In the semiconductor device 200 of the present embodiment, the defect regions 80a and 80b are disposed within the respective body contact region 79a, 79b. That is, each of the defect regions 80a and 80b is disposed in the region that is separated farther from the pn junctions. Due to this, the defects trapped in the defect regions 80a and 80b by the gettering effect do not adversely affect the voltage resistance.

Fifth Embodiment (Configuration of Semiconductor Device 200A)

Figure 11:
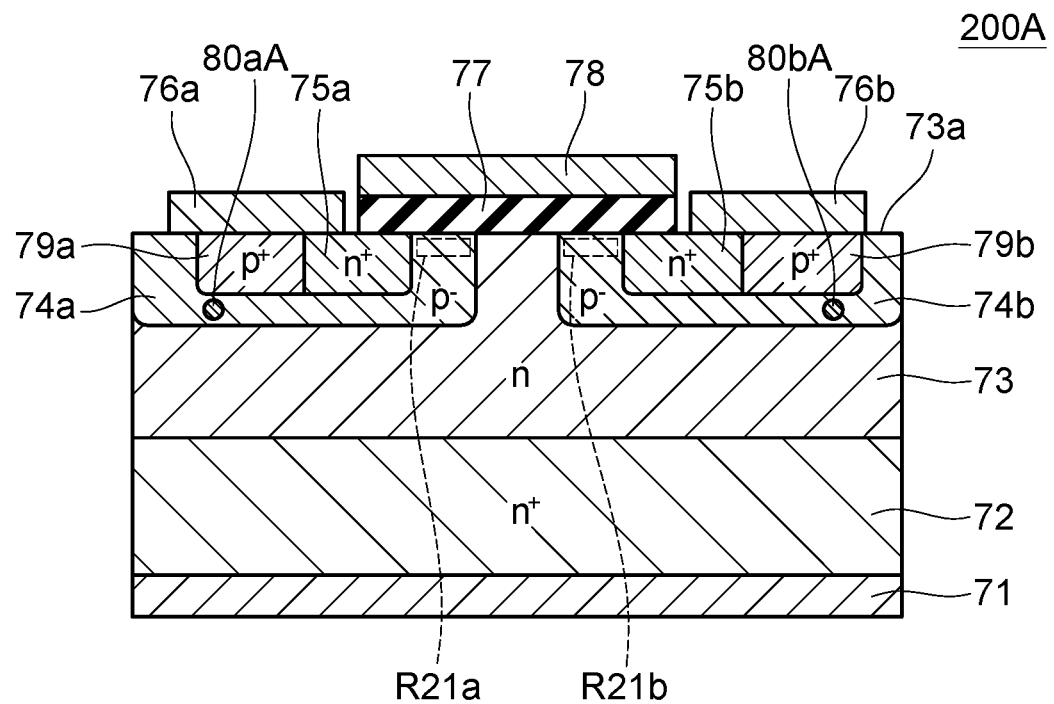
FIG. 11 is a schematic cross-sectional view of a semiconductor device 200A according to a fifth embodiment.

FIG. 11 shows a schematic cross-sectional view of a semiconductor device 200A according to the fifth embodiment. The semiconductor device 200A according to the fifth embodiment differs in disposed positions of defect regions from the semiconductor device 200 according to the fourth embodiment. In the description below, configurations that are same between the semiconductor device 200A according to the fifth embodiment and the semiconductor device 200 according to the fourth embodiment are given same reference signs, and descriptions thereof will be omitted.

Defect regions 80aA and 80bA are disposed within the body regions 74a and 74b. Due to this, in addition to the nitrogen vacancies in the body regions 74a and 74b, the nitrogen vacancies in the in the body contact regions 79a and 79b can also be combined in gallium vacancies in the defect regions 80aA and 80bA, by which the gettering effect can be achieved. In the semiconductor device 200A provided with such defect regions 80aA and 80bA, same effects as those of the semiconductor device 200 according to the fourth embodiment can be achieved.

Sixth Embodiment (Configuration of Semiconductor Device 300)

Figure 12:
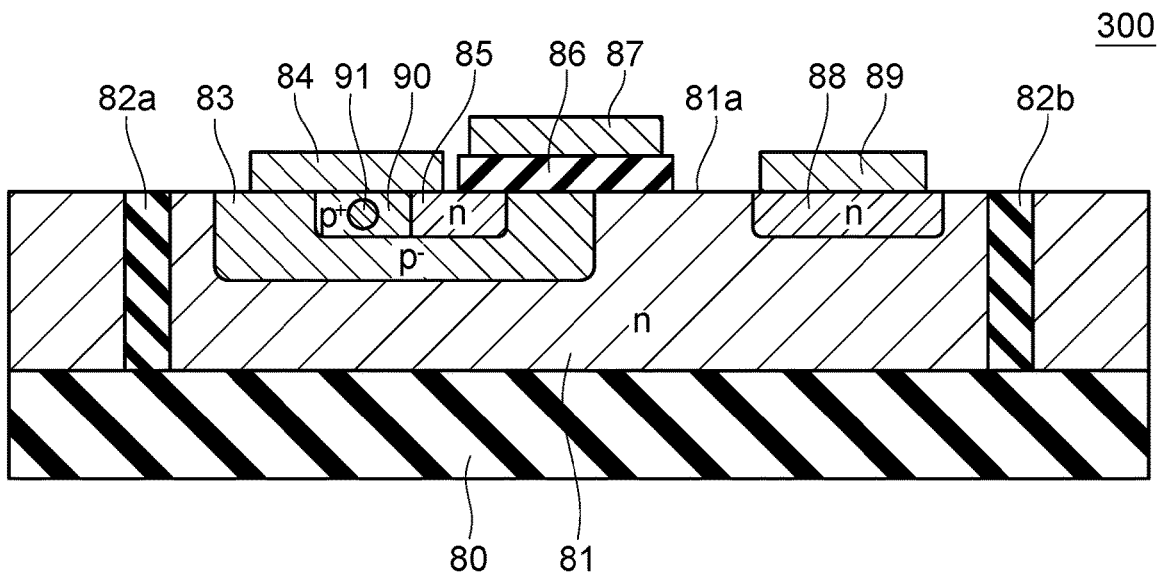
FIG. 12 is a schematic cross-sectional view of a semiconductor device 300 according to a sixth embodiment.

FIG. 12 shows a schematic cross-sectional view of a semiconductor device 300 according to the sixth embodiment. The semiconductor device 300 is a horizontal MOSFET provided with a planar gate. In FIG. 12, 80 is an insulation substrate, and 82a, 82b are insulation walls. 81 is an n-type GaN layer. A body region 83 is a $p^-$-type conductive region obtained by ion-implanting magnesium from an upper surface 81a of the n-type GaN layer 81 and thermally treating the same. A source region 85 and a drain region 88 are n-type conductive regions obtained by implanting Si from the upper surface 81a and thermally treating the same.

A body contact region 90 is provided within the body region 83. The body contact region 90 is a $p^+$-type conductive region obtained by ion-implanting magnesium from the upper surface 81a and thermally treating the same. A defect region 91 is provided within the body contact region 90. A source electrode 84 contacts a part of an upper surface of the body region 83, an upper surface of the body contact region 90, and a part of an upper surface of the source region 85. A drain electrode 89 contacts a part of an upper surface of the drain region 88. Further, a gate electrode 87 is provided on a part of the upper surface of the source region 85, a part of the upper surface of the body region 83, and a part of the upper surface 81a of the n-type GaN layer 81 via a gate insulating film 86.

In the semiconductor device 300 provided with such a defect region 91, same effects as those of the semiconductor device 200 according to the fourth embodiment can be achieved.

Seventh Embodiment (Configuration of Semiconductor Device 300A)

Figure 13:
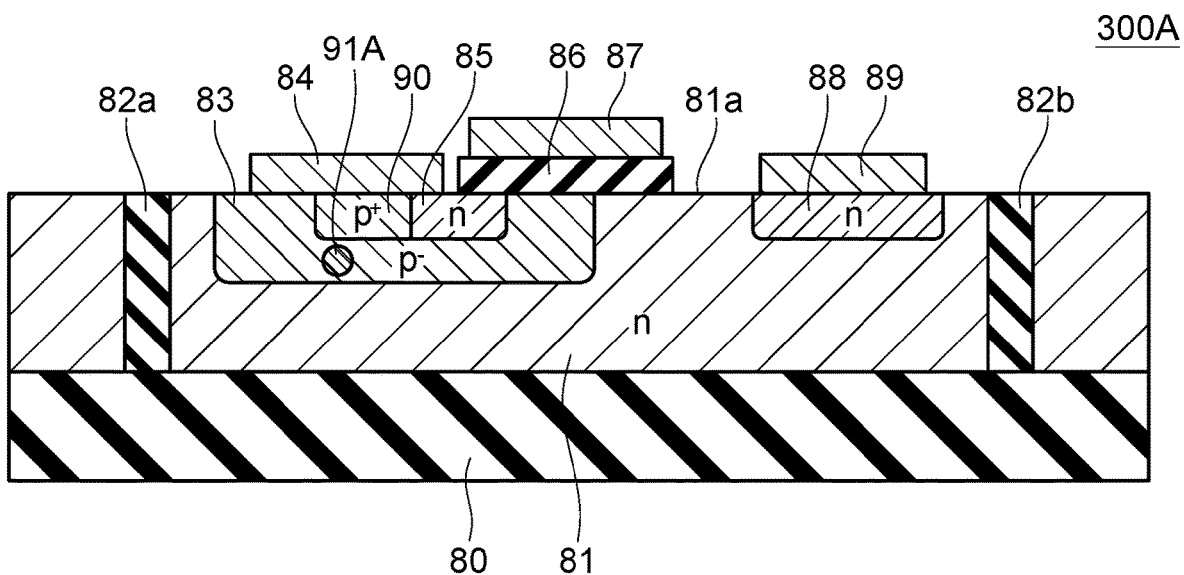
FIG. 13 is a schematic cross-sectional view of a semiconductor device 300A according to a seventh embodiment.

FIG. 13 shows a schematic cross-sectional view of a semiconductor device 300A according to the seventh embodiment. The semiconductor device 300A according to the seventh embodiment differs in a disposed position of a defect region from the semiconductor device 300 according to the sixth embodiment. In the description below, configurations that are same between the semiconductor device 300A according to the seventh embodiment and the semiconductor device 300 according to the sixth embodiment are given same reference signs, and descriptions thereof will be omitted.

A defect region 91A is provided within the body region 83. Due to this, in addition to nitrogen vacancies in the body region 83, nitrogen vacancies in the body contact region 90 can also be combined in gallium vacancies in the defect region 91A, by which the gettering effect can be achieved. In the semiconductor device 300A provided with such a defect region 91A, same effects as those of the semiconductor device 300 according to the sixth embodiment can be achieved.

While specific embodiments of the present invention have been described in detail above, such description is for illustrative purposes only and is not intended to limit the scope and claims of the invention. Techniques described in the claims of the invention include various modifications and changes made to the specific examples illustrated above. Furthermore, it is to be understood that the technical elements described in the present specification and the drawings exhibit technical usefulness solely or in various combinations thereof and shall not be limited to the combinations described in the claims at the time of filing. The techniques illustrated in the present specification and the drawings are to achieve a plurality of objectives at the same time, and technical usefulness is exhibited by attaining any one of such objectives.

(Variants)

The element implanted upon fabricating the defect regions 47 is not limited to nitrogen. Inert gas element(s) such as argon (Ar) and helium (He), and a hydrogen (H) element may be used. Alternatively, group III element(s) other than gallium (Ga) being a group III element constituting GaN being the group III nitride semiconductor in the embodiments may be used. Aluminum (Al) may be exemplified as an example of such group III element(s). The element ion-implanted to fabricate the defect regions 47 is present in at least a part of the defect regions 47. As such, for example, in a case of fabricating the defect regions 47 using aluminum (Al), aluminum is present in at least a part of the defect regions 47.

Orders in which the defect region forming step (step S2) and the body contact region forming step (step S3) are carried out are not limited. The orders of these steps may be switched, and another step may be inserted between these steps.

The group III nitride semiconductor constituting the semiconductor substrate 10 is not limited to GaN, and for example, it maybe AlN (aluminum nitride), InN (indium nitride), or mixed crystal(s) thereof.

In the above embodiments, magnesium (Mg) is used as an example of a group II element for constituting p-type regions, however, no limitation is made to such a configuration. The group II element may for example be beryllium (Be) or calcium (Ca).

Further, the first and second embodiments described cases where there are three defect regions. Further, the third to seventh embodiments described cases where there is one defect region. However, not being limited to these configurations, a number of defect region(s) may be designed arbitrarily.

The GaN substrate is an example of a group III nitride semiconductor substrate. The defect regions 47 are each an example of a first region. The gallium vacancies are an example of group III element vacancies. Step S2 is an example of introducing group III element vacancies. The body contact region 46 is an example of a second region. Magnesium is an example of an acceptor element. Step S3 is an example of introducing an acceptor element. Step S4 is an example of performing annealing. The aluminum ions are an example of group III element ions. Nitrogen, argon, and helium are each an example of an inert gas element. The source electrode 44 is an example of a first electrode.

What is claimed is:

1. A gallium nitride semiconductor device comprising:
a first region; and
a second region,
wherein
the first region is formed in a part of second region by implanting of group III element ions or inert gas ions,
the first region includes gallium vacancies that are formed by the implanting of the group III element ions or the inert gas ions and nitrogen vacancies that are formed by implanting of additional acceptor element ions,
the second region includes nitrogen vacancies that are formed by the implanting of the additional acceptor element ions,
a concentration of the nitrogen vacancies in the first region is higher than a concentration of the nitrogen vacancies in the second region, and
in the first region, the nitrogen vacancies are combined in the gallium vacancies.

2. The gallium nitride semiconductor device according to claim 1, wherein
the concentration of the nitrogen vacancies in the second region is lower than an acceptor element concentration in the second region.

3. The gallium nitride semiconductor device according to claim 1, wherein
particles of the acceptor element are distributed in the second region according to an impurity distribution generated by ion implantation.

4. The gallium nitride semiconductor device according to claim 1, further comprising:
a group III nitride semiconductor substrate including a part of the first region and a part of the second region located on a surface of the group III nitride semiconductor substrate; and
a first electrode contacting the part of the first region and the part of the second region that are located on the surface of the group III nitride semiconductor substrate.

5. The gallium nitride semiconductor device according to claim 1, further comprising:
a group III nitride semiconductor substrate including a part of the second region located on a surface of the group III nitride semiconductor substrate and the first region located inside the group III nitride semiconductor substrate; and
a first electrode contacting the part of the second region that is located on the surface of the group III nitride semiconductor substrate.

6. The gallium nitride semiconductor device according to claim 1, further comprising:
an n-type drift layer;
a body layer disposed on an upper surface of the drift layer; and
a trench gate extending from an upper surface of the body layer into the drift layer, wherein
the first region and the second region are disposed inside the body layer, and
a distance between the second region and the trench gate is smaller than a distance between the first region and the trench gate.

7. A method of manufacturing the gallium nitride semiconductor device according to claim 1, the method comprising:
introducing the gallium vacancies to the first region of the gallium nitride semiconductor device;
introducing the additional acceptor element ions to the second region of the gallium nitride semiconductor device, the second region contacting the first region at least in part; and
performing annealing to activate the additional acceptor element ions in the second region.

8. The method of manufacturing a gallium nitride semiconductor device according to claim 7, wherein
the introducing of gallium vacancies includes ion-implanting the group III element ions or the inert gas ions.

9. The gallium nitride semiconductor device according to claim 1, wherein
the first region includes composite defects that result from combining the nitrogen vacancies and the gallium vacancies.

10. The gallium nitride semiconductor device according to claim 1, further comprising a group III nitride semiconductor substrate, wherein
in a vertical cross section of the substrate, an entire outer perimeter of the first region is surrounded by the second region.

* * * * *